(12) United States Patent
Tsukizawa et al.

(10) Patent No.: US 7,701,304 B2
(45) Date of Patent: Apr. 20, 2010

(54) VOLTAGE CONTROLLED OSCILLATOR, AND PLL CIRCUIT AND RADIO COMMUNICATION APPARATUS USING THE SAME

(75) Inventors: Takayuki Tsukizawa, Osaka (JP); Koji Takinami, Saratoga, CA (US)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 12/035,250

(22) Filed: Feb. 21, 2008

(65) Prior Publication Data
US 2008/0204157 A1 Aug. 28, 2008

(30) Foreign Application Priority Data
Feb. 26, 2007 (JP) ............... 2007-045985

(51) Int. Cl.
*H03B 5/18* (2006.01)
(52) U.S. Cl. ............... 331/117 R; 331/177 V
(58) Field of Classification Search ............. 331/117 R, 331/117 FE, 167, 36 C, 177 V
See application file for complete search history.

(56) References Cited
U.S. PATENT DOCUMENTS
6,995,626 B2 2/2006 Oehm et al.
7,321,271 B2 * 1/2008 Takinami et al. ........ 331/117 R
7,408,422 B2 * 8/2008 Dedieu et al. ........... 331/177 V
2005/0190002 A1 * 9/2005 Takinami et al. ........ 331/117 R

FOREIGN PATENT DOCUMENTS
JP 2004-147310 5/2004

\* cited by examiner

*Primary Examiner*—Robert Pascal
*Assistant Examiner*—Ryan J Johnson
(74) *Attorney, Agent, or Firm*—Wenderoth, Lind & Ponack, L.L.P.

(57) ABSTRACT

A voltage controlled oscillator has a reference voltage generation section for generating a plurality of reference voltage based on a power supply voltage. Reference voltages Vref1, Vref2, and Vref3 are inputted to variable capacitance circuits A, B, and C, respectively. Reference voltages Vref1, Vref2, and Vref3 each has a fixed value, and a difference between the first reference voltage Vref1 and the second reference voltage Vref2 and a difference between the second reference voltage Vref2 and the third reference voltage Vref3 represent values different from each other. A control voltage Vt for feedback-controlling an oscillation frequency is inputted to each of the other of the terminals of the variable capacitance element of each of the n variable capacitance circuits such that the control voltage Vt having the same value is inputted to the each of the other of the terminals.

6 Claims, 16 Drawing Sheets

FIG. 8

|  | MAXIMUM VALUE / MINIMUM VALUE ||
|---|---|---|
|  | CAPACITANCE CHANGE RATE | FREQUENCY SENSITIVITY |
| CONVENTIONAL ART | 2.33 | 2.53 |
| SETTING EXAMPLE 1 OF THE PRESENT INVENTION | 2.75 | 1.57 |
| SETTING EXAMPLE 2 OF THE PRESENT INVENTION | 2.62 | 1.53 |
| SETTING EXAMPLE 3 OF THE PRESENT INVENTION | 2.60 | 1.48 |

F I G. 1 4   PRIOR ART
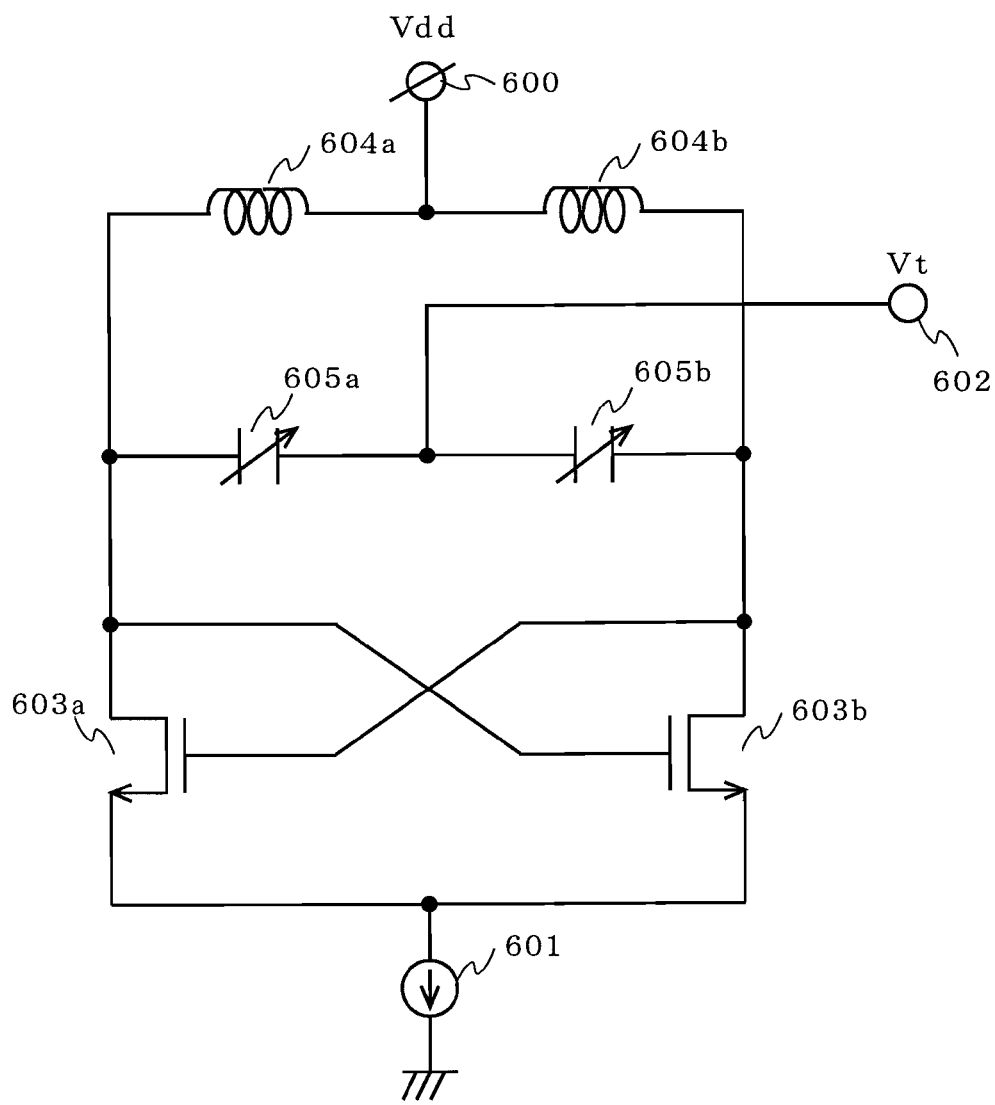

F I G. 1 6   PRIOR ART
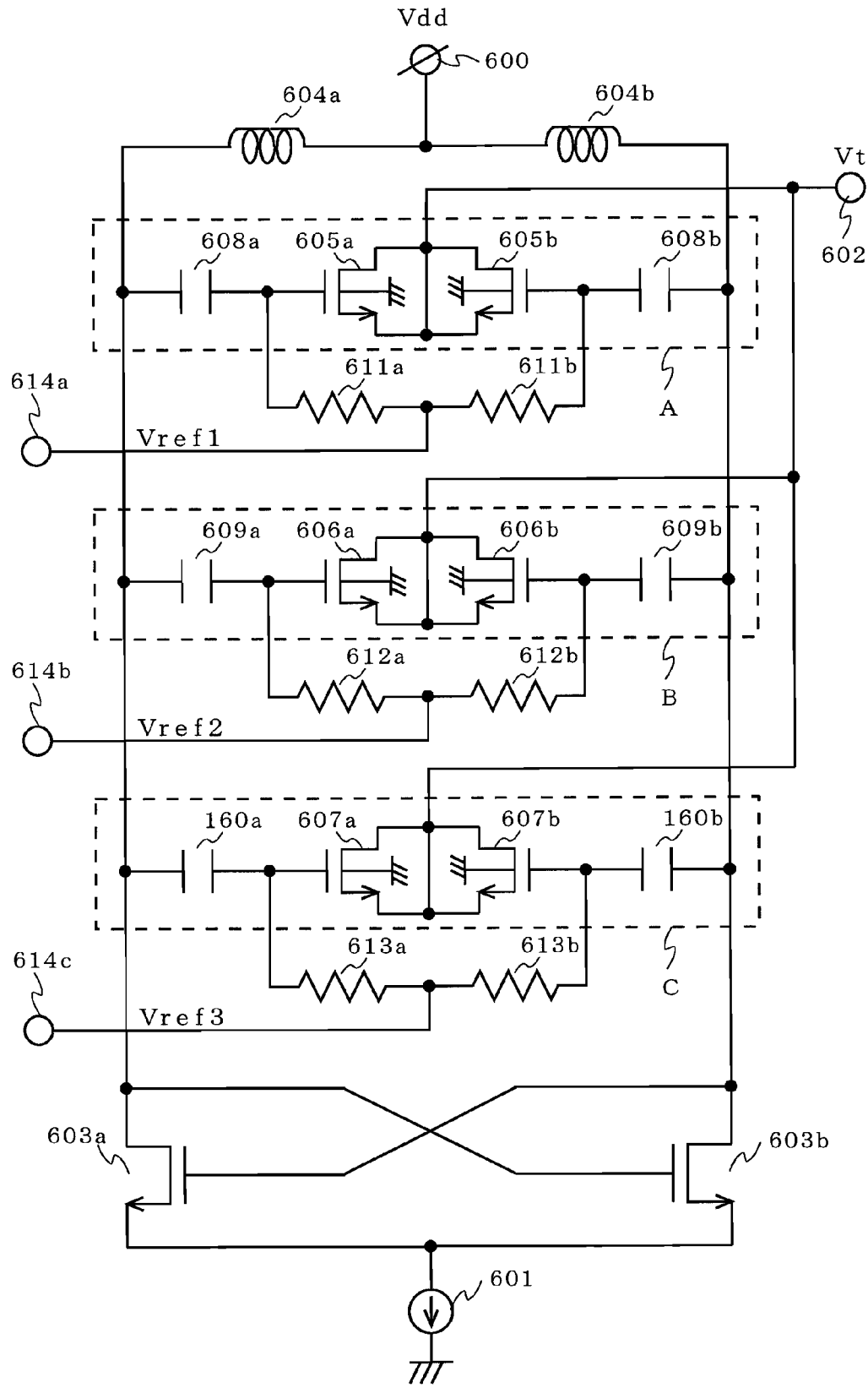

VOLTAGE CONTROLLED OSCILLATOR, AND PLL CIRCUIT AND RADIO COMMUNICATION APPARATUS USING THE SAME

BACKGROUND OF THE INVENTION

1. Field of the Invention

The present invention relates to a voltage controlled oscillator used for generating a local oscillation signal of a radio communication device, and the like, and a PLL circuit and a radio communication apparatus using the same.

2. Description of the Background Art

A voltage controlled oscillator (VCO) is widespread as a device for generating a local oscillation signal of a radio communication device. FIG. 14 is a diagram illustrating an exemplary configuration of a conventional voltage controlled oscillator. The conventional voltage controlled oscillator includes: an inductor 604a and an inductor 604b; a variable capacitance element 605a and a variable capacitance element 605b; an oscillation transistor 603a and an oscillation transistor 603b; and a current source 601. In FIG. 14, a bias circuit and the like are not shown.

The inductor 604a and the inductor 604b, and the variable capacitance element 605a and the variable capacitance element 605b form a parallel resonant circuit. A capacitance value of the variable capacitance element 605a depends on a voltage between both terminals of the variable capacitance element 605a, and a capacitance value of the variable capacitance element 605b depends on a voltage between both terminals of the variable capacitance element 605b. Specifically, a capacitance value of each of the variable capacitance element 605a and the variable capacitance element 605b depends on a control voltage Vt applied to a frequency control terminal 602 from an external circuit. As a result, a resonant frequency of the parallel resonant circuit is variable. The conventional voltage controlled oscillator oscillates in the neighborhood of a resonant frequency of the parallel resonant circuit, and therefore it is possible, by adjusting control voltage Vt, to control the oscillation frequency of the voltage-controlled oscillator to be a desired frequency. The oscillation transistor 603a and the oscillation transistor 603b each generate a negative resistance so as to cancel a loss caused due to a parasitic resistance component of the parallel resonant circuit, thereby satisfying an oscillation condition.

A relationship between a control voltage for the voltage controlled oscillator and an oscillation frequency thereof substantially depends on characteristic of a variable capacitance element. Therefore, it is preferable to use a variable capacitance element which allows its capacitance to gradually change in a wide range of control voltage. That is, it is preferable that the oscillation frequency linearly changes in a wide range of control voltage Vt.

The reason is as follows. When the conventional voltage controlled oscillator is used so as to form a PLL (phase-locked loop) circuit, transient response characteristic and/or noise band characteristic of the PLL circuit depend on a frequency sensitivity (a rate at which the oscillation frequency changes against the control voltage Vt). Therefore, when a frequency sensitivity changes in accordance with a frequency (that is, when a frequency nonlinearly changes), the characteristic of the PLL circuit itself changes in accordance with the frequency. Further, when a frequency sensitivity against the control voltage Vt is high, the frequency changes due to even a substantially low noise applied to the frequency control terminal 602, whereby a problem arises that phase noise characteristic is deteriorated.

When the conventional voltage controlled oscillator described above is provided on a semiconductor substrate by using a particular process for forming the variable capacitance element 605a and the variable capacitance element 605b, cost is increased. Therefore, it is difficult to realize the use of the variable capacitance element improving linear characteristic. FIG. 15A shows a symbol representing an inversion-type variable capacitance element using a gate capacitance between a gate terminal and a terminal connected to a drain terminal and a source terminal, the inversion-type variable capacitance element being widespread for CMOS process. FIG. 15B shows a change in the gate capacitance obtained when a reference voltage Vref is applied to the gate terminal of a MOS transistor, and the control voltage Vt is applied to the drain terminal and the source terminal.

Thus, in the variable capacitance element using the gate capacitance of the MOS transistor which is typically used, a capacitance value rapidly changes in the neighborhood of a threshold voltage (voltage Vth in FIG. 15B), so that the oscillation frequency also rapidly changes in the neighborhood of the threshold value. As a result, a problem arises that transient response characteristic and/or noise band characteristic of the PLL circuit using the conventional voltage controlled oscillator substantially change depending on a frequency.

In order to solve the problems, the following circuit has been already suggested.

FIG. 16 is a diagram illustrating a voltage controlled oscillator using a technique for improving linear characteristic represented by a conventional variable capacitance element (see, for example, U.S. Pat. No. 6,995,626).

The conventional voltage controlled oscillator shown in FIG. 16 includes: inductors 604a and 604b; variable capacitance elements 605a, 605b, 606a, 606b, 607a, and 607b; DC cut capacitive elements 608a, 608b, 609a, 609b, 610a, and 610b each of which cut a direct current; high frequency interruption resistances 611a, 611b, 612a, 612b, 613a, and 613b; oscillation transistors 603a and 603b; and a current source 601. In FIG. 16, the same components as shown in FIG. 14 are denoted by the same corresponding reference numerals as used for FIG. 14, and no description is given for the same components.

The variable capacitance elements 605a and 605b, and the DC cut capacitive elements 608a and 608b form a variable capacitance circuit A. The variable capacitance elements 606a and 606b, and the DC cut capacitive elements 609a and 609b form a variable capacitance circuit B. The variable capacitance elements 607a and 607b, and the DC cut capacitive elements 610a and 610b form a variable capacitance circuit C. The variable capacitance elements 605a, 605b, 606a, 606b, 607a, and 607b are each an inversion-type MOS transistor using a capacitance between a gate terminal and a terminal connected to a drain terminal and a source terminal, the inversion-type MOS transistor being used for CMOS process. Capacitance values of the variable capacitance elements of the variable capacitance circuits A, B, and C change in accordance with a control voltage Vt applied to a frequency control terminal 602 and reference voltages Vref1, Vref2, and Vref3, respectively. Here, the reference voltage Vref1 is inputted to a connection point between the variable capacitance element 605a and the DC cut capacitive element 608a, and a connection point between the variable capacitance element 605b and the DC cut capacitive element 608b. The reference voltage Vref2 is inputted to a connection point between the variable capacitance element 606a and the DC cut capacitive element 609a, and a connection point between the variable capacitance element 606b and the DC cut capacitive element 609b. The reference voltage Vref3 is inputted to a connection point between the variable capacitance element 607*a* and the DC cut capacitive element 610*a*, and a connection point between the variable capacitance element 607*b* and the DC cut capacitive element 610*b*. As a result, a resonant frequency of a parallel resonant circuit is variable.

When the reference voltages Vref1, Vref2, and Vref3 are different at intervals of voltage Vd, characteristics of the variable capacitance circuits A, B, and C change against the control voltage Vt, as shown in FIG. 17A, at intervals of Vd (160 mV in FIG. 17A). The capacitance of the parallel resonant circuit is a sum (that is, a total capacitance) of the capacitances of the three variable capacitance circuits A, B, and C, and the total capacitance represents the characteristic indicated by the dashed-dotted line in FIG. 17B. That is, the capacitance is allowed to gradually change against the control voltage Vt.

The oscillation frequency fo of the voltage controlled oscillator is obtained in accordance with equation [1] as follows when an inductance of an inductor of the parallel resonant circuit is represented as L, the capacitance value of the variable capacitance circuits A, B, and C is represented as Cv, and a capacitance value of a parasitic capacitance generated in a negative resistance circuit or the like is represented as C.

$$fo = 1/(2\pi \times \sqrt{L \times (Cv+C)}) \quad [1]$$

When equation [1] is solved for obtaining the capacitance value Cv of the variable capacitance circuits A, B, and C, equation [2] is obtained as follows.

$$Cv = C - 1/(4\pi^2 L fo^2) \quad [2]$$

The inductance L and the capacitance value C of the parasitic capacitance each represents a constant value. Therefore, it is necessary to change the capacitance value Cv in proportion to $1/(fo^2)$, instead of linearly changing the capacitance value Cv of the variable capacitance circuits A, B, and C, so as to linearly change the oscillation frequency fo against the control voltage Vt.

In the conventional improvement method described above, however, it is possible to improve the linear characteristic represented by the capacitance changing in a wide range of control voltage by gradually changing the capacitance against the control voltage Vt, whereas the improvement of the linear characteristic represented by the oscillation frequency of the voltage controlled oscillator changing in a wide range of control voltage is limited.

Further, when the number of variable capacitance circuits to be provided in parallel with each other is increased, the linear characteristic represented by the capacitance of the variable capacitance circuit can be improved. However, an area of a semiconductor chip needs to be increased and/or a layout is complicated, and therefore it is necessary to limit the number of the variable capacitance circuits connected in parallel with each other, whereby it is difficult to improve the linear characteristic represented by the frequency changing in a wide range of control voltage.

SUMMARY OF THE INVENTION

Therefore, an object of the present invention is to provide a voltage controlled oscillator for improving linear characteristic represented by an oscillation frequency changing in a wide range of control voltage without increasing the number of variable capacitance circuits connected in parallel with each other, and a PLL circuit and a radio communication apparatus using the same.

The present invention is directed to a voltage controlled oscillator, and a radio communication apparatus having a PLL circuit of outputting a signal of a target frequency, the PLL circuit having the voltage controlled oscillator. In order to attain the object mentioned above, the voltage controlled oscillator of the present invention comprises: an inductor circuit having an inductor; n pieces of variable capacitance circuit having a variable capacitance element and having blocking capacitors of interrupting a direct current at both ends thereof, the n pieces of variable capacitance circuit including first, second and third variable capacitance circuits, in which n is an integer greater than or equal to three; a negative resistance circuit, and a reference voltage generation section having m pieces of resistance connected in series between a power supply voltage and a grounding potential, in which m is an integer greater than or equal to two.

The inductor circuit, the n pieces of variable capacitance circuit, and the negative resistance circuit are connected in parallel, and the reference voltage generation section divides the power supply voltage by use of the m pieces of resistance to supply m pieces of reference voltage to one terminal of the variable capacitance elements of the n pieces of variable capacitance circuit from m pieces of connecting point between adjacent resistances of the m pieces of resistance, and a control voltage of feedback-controlling an oscillation frequency is inputted to the other terminals of the variable capacitance elements of the n pieces of variable capacitance circuits, and the n pieces of variable capacitance circuit are connected in parallel with each other so that each capacitance variation characteristic against the control voltage inputted to the variable capacitance circuit has the same-directed characteristic, and the control voltage inputted to the other terminals of the variable capacitance elements of the n pieces of variable capacitance circuits is the same voltage, and, in the reference voltage generation section, a first resistance and a second resistance connected successively are configured so that a first reference voltage is supplied from a connection point positioned between the first resistance and the power supply voltage, a second reference voltage is supplied from a connection point between the first resistance and the second resistance, a third reference voltage is supplied from a connection point positioned between the second resistance and the grounding potential, and the resistance values of the first resistance and the second resistance are different than each other, and, of the n pieces of variable capacitance circuits, the first reference voltage is inputted to one of the terminals of the first variable capacitance circuit, the second reference voltage is inputted to one of the terminals of the second variable capacitance circuit, and the third reference voltage is inputted to one of the terminals of the third variable capacitance circuit, and the first reference voltage, the second reference voltage, and the third reference voltage are fixed respectively, and a k-th variable capacitance circuit has a capacitance value different from a (k−1)th variable capacitance circuit, in which k is an integer ranging from 2 to n, inclusive.

Further, in this configuration, it is preferable that a first difference between the first reference voltage and the second reference voltage and a second difference between the second reference voltage and the third reference voltage are each different than each other.

Further, at least one of the first variable capacitance circuit, the second variable capacitance circuit, and the third variable capacitance circuit is an accumulation MOS.

According to the present invention described above, it is possible to realize a voltage controlled oscillator capable of gradually changing a capacitance in a wide range of control voltage without increasing a chip area, so as to improve linear characteristic represented by a rate at which an oscillation frequency changes against the control voltage, and a PLL circuit and a radio communication apparatus using the voltage controlled oscillator.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram illustrating linear characteristic of the oscillation frequency according to the embodiment of the present invention;

FIG. 14 is a diagram illustrating a configuration of a conventional voltage controlled oscillator;

FIG. 16 is a diagram illustrating a structure of another conventional voltage controlled oscillator.

DESCRIPTION OF THE PREFERRED EMBODIMENTS

Figure 1:
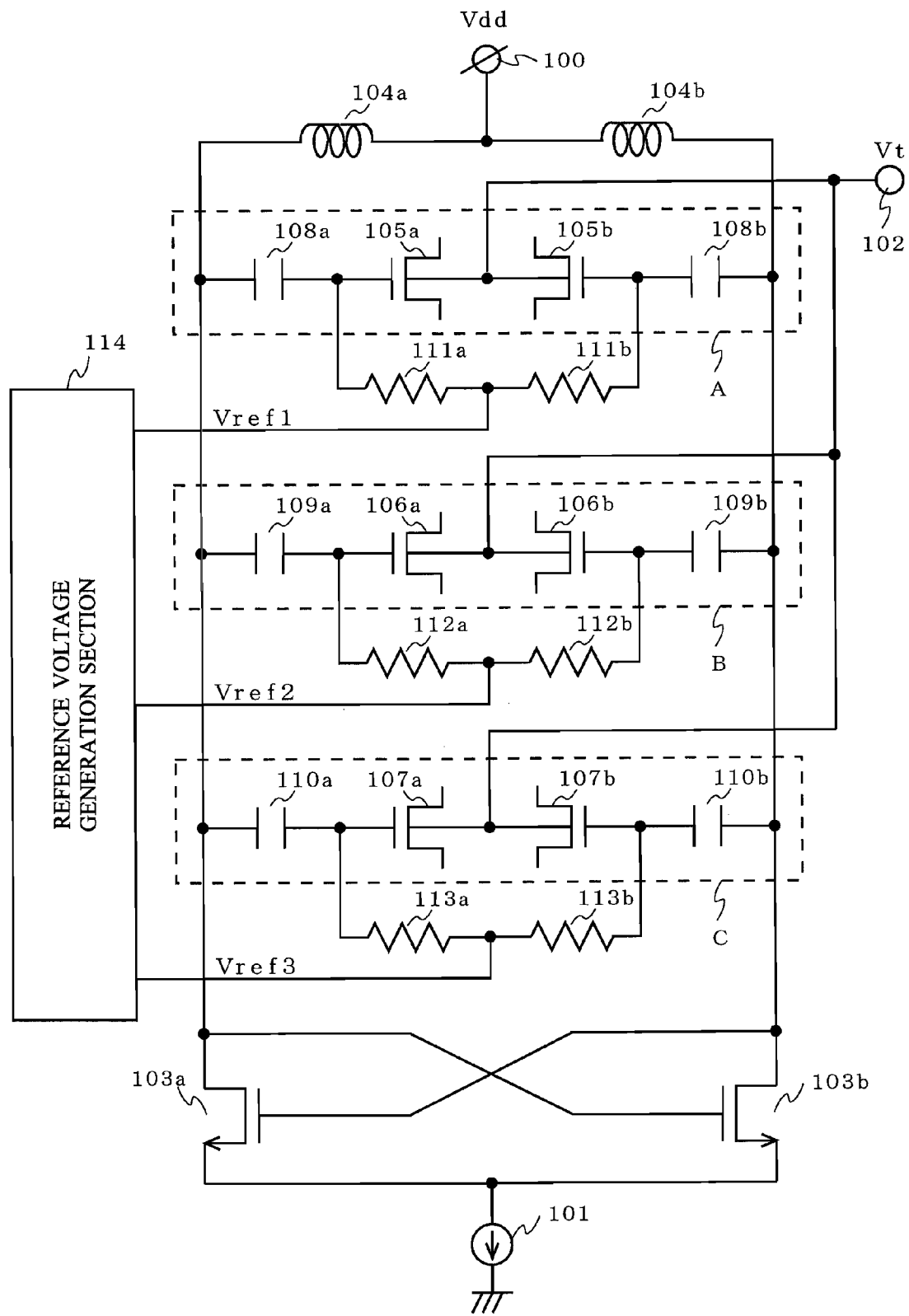
FIG. 1 is a diagram illustrating a configuration of a voltage controlled oscillator according to an embodiment of the present invention.

FIG. 1 is a diagram illustrating a configuration of a voltage controlled oscillator according to an embodiment of the present invention. A bias circuit and the like are not shown. In FIG. 1, the voltage controlled oscillator of the present embodiment comprises: inductors 104a and 104b; variable capacitance elements 105a, 105b, 106a, 106b, 107a, and 107b each of which use a gate capacitance and are used in CMOS process; DC cut capacitive elements 108a, 108b, 109a, 109b, 110a, and 110b each of which cuts a direct current; high frequency interruption resistances 111a, 111b, 112a, 112b, 113a, and 113b; oscillation transistors 103a and 103b; a current source 101; and a reference voltage generation section 114.

The inductors 104a and 104b are connected in series with each other, and are connected to a power supply terminal 100 at a connection point at which the inductors 104a and 104b are connected to each other, thereby forming an inductor circuit. The variable capacitance elements 105a and 105b are connected to each other at a back gate terminal. Further, the variable capacitance elements 105a and 105b are connected in series with the DC cut capacitive elements 108a and 108b at gate terminals, respectively. Thus, the variable capacitance elements 105a and 105b and the DC cut capacitive elements 108a and 108b form a variable capacitance circuit A. In the same connection manner, the variable capacitance elements 106a and 106b and the DC cut capacitive elements 109a and 109b form a variable capacitance circuit B, and the variable capacitance elements 107a and 107b and the DC cut capacitive elements 110a and 110b form a variable capacitance circuit C. The oscillation transistors 103a and 103b are cross-coupled to each other so as to form a negative resistance circuit. A MOS transistor or a bipolar transistor is suitable for the oscillation transistors 103a and 103b. The inductor circuit, the variable capacitance circuits A, B, and C, and the negative resistance circuit are connected in parallel with each other.

The back gate terminal at which the variable capacitance elements 105a and 105b of the variable capacitance circuit A are connected to each other, the back gate terminal at which the variable capacitance elements 106a and 106b of the variable capacitance circuit B are connected to each other, and the back gate terminal at which the variable capacitance elements 107a and 107b of the variable capacitance circuit C are connected to each other, are connected to a frequency control terminal 102 to which a control voltage Vt is applied so as to feedback-control an oscillation frequency.

Further, the gate terminals of the variable capacitance elements 105a and 105b of the variable capacitance circuit A are connected through the resistances 111a and 111b, respectively, to an output terminal through which a reference voltage Vref1 is supplied from the reference voltage generation section 114. The gate terminals of the variable capacitance elements 106a and 106b of the variable capacitance circuit B are connected through the resistances 112a and 112b, respectively, to an output terminal through which a reference voltage Vref2 is supplied from the reference voltage generation section 114. The gate terminals of the variable capacitance elements 107a and 107b of the variable capacitance circuit C are connected through the resistances 113a and 113b, respectively, to an output terminal through which a reference voltage Vref3 is supplied from the reference voltage generation section 114.

Figure 2A:
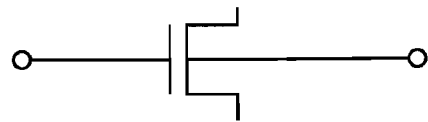
FIG. 2A shows an element used for a variable capacitance element of the voltage controlled oscillator of the present invention.
Figure 2B:
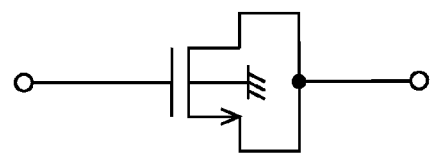
FIG. 2B shows an element used for a variable capacitance element of a conventional voltage controlled oscillator.
Figure 2C:
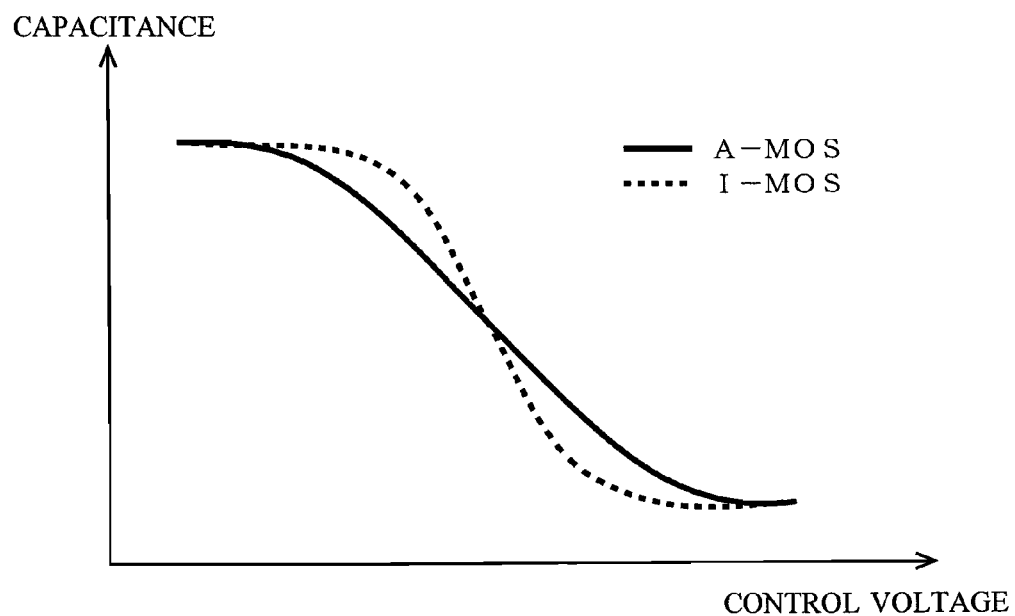
FIG. 2C is a diagram illustrating a comparison in capacitance characteristic between the variable capacitance element of the present invention and the variable capacitance element of a conventional art.

FIG. 2A shows an accumulation-type MOS transistor (hereinafter, referred to as an A-MOS transistor) using a capacitance between the gate terminal and the back gate terminal. The A-MOS transistor is used for CMOS process and is used for each of the variable capacitance elements 105a, 105b, 106a, 106b, 107a and 107b of the present invention. In the A-MOS transistor, a capacitance value changes against the control voltage Vt more gradually than in an inversion-type MOS transistor (hereinafter, referred to as an I-MOS transistor) shown in FIG. 2B (see FIG. 2C).

Figure 3A:
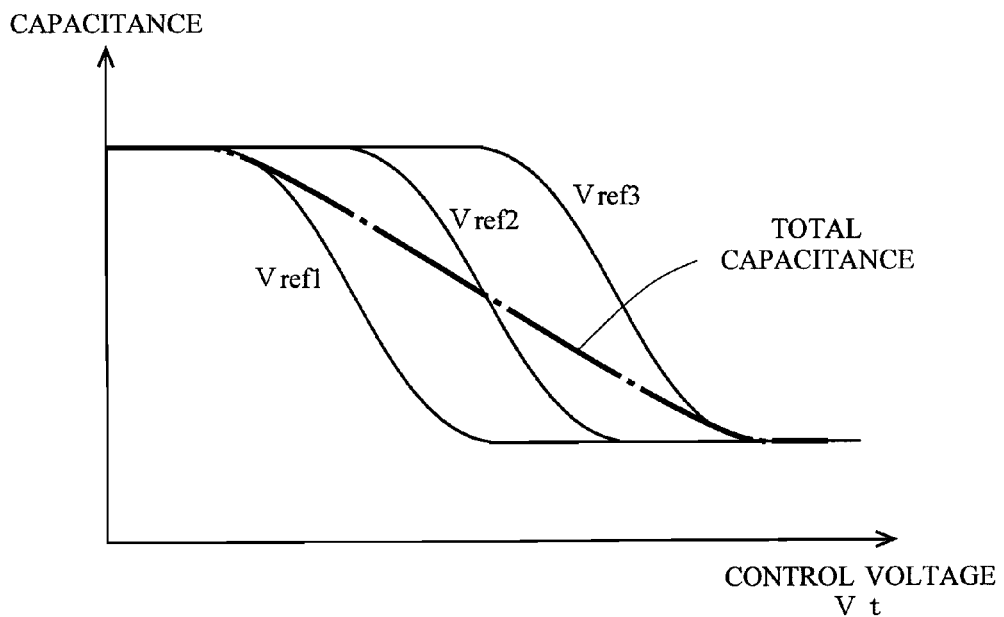
FIG. 3A is a diagram illustrating capacitance characteristic obtained when an A-MOS transistor is used for the variable capacitance element.
Figure 3B:
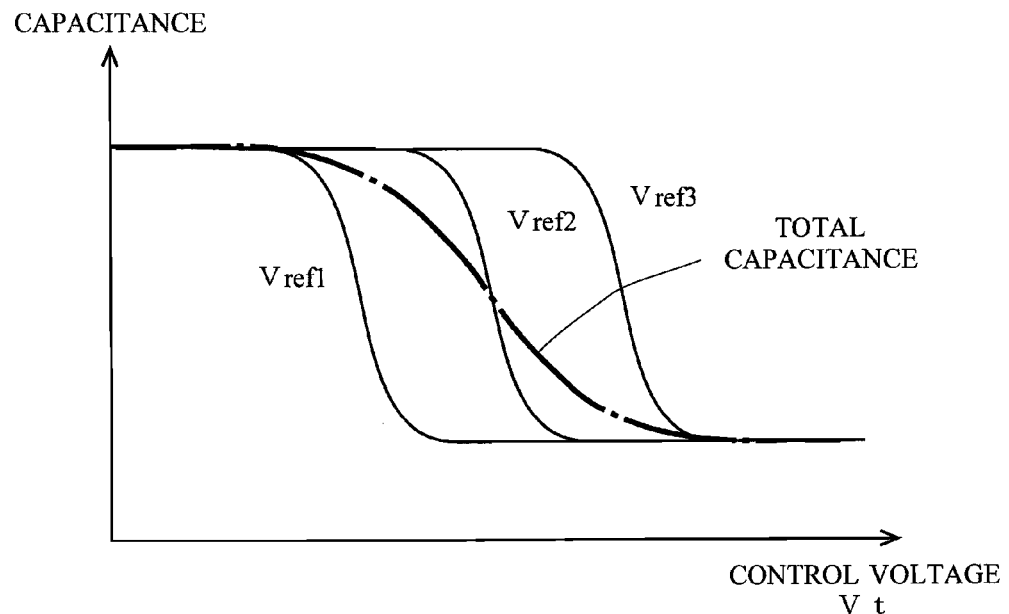
FIG. 3B is a diagram illustrating capacitance characteristic obtained when an I-MOS transistor is used for the variable capacitance element.

For example, the three variable capacitance circuits A, B, and C are connected in parallel with each other, and a difference between the reference voltage Vref1 and the reference voltage Vref2 is equal to a difference between the reference voltage Vref2 and the reference voltage Vref3. In this case, capacitance characteristic obtained when the A-MOS transistor is used for the variable capacitance element is as shown in FIG. 3A, and capacitance characteristic obtained when the I-MOS transistor is used for the variable capacitance element is as shown in FIG. 3B. The dashed-dotted lines in FIG. 3A and FIG. 3B each indicate a total capacitance value. FIG. 3A and FIG. 3B indicate that the A-MOS transistor improves linear characteristic of the capacitance changing in a widen range of control voltage Vt as compared to the I-MOS transistor. Accordingly, as compared to the I-MOS transistor, the A-MOS transistor enables the reduced number of the variable capacitance circuits connected in parallel with each other to gradually change a capacitance value in a wide range of control voltage. Therefore, when the difference between the reference voltage Vref1 and the reference voltage Vref2, and the difference between the reference voltage Vref2 and the reference voltage Vref3 are optimally controlled, the capacitance value is able to be changed in proportion to $1/(fo^2)$.

Hereinafter, an operation performed by the voltage controlled oscillator according to the embodiment of the present invention will be described.

Figure 4:
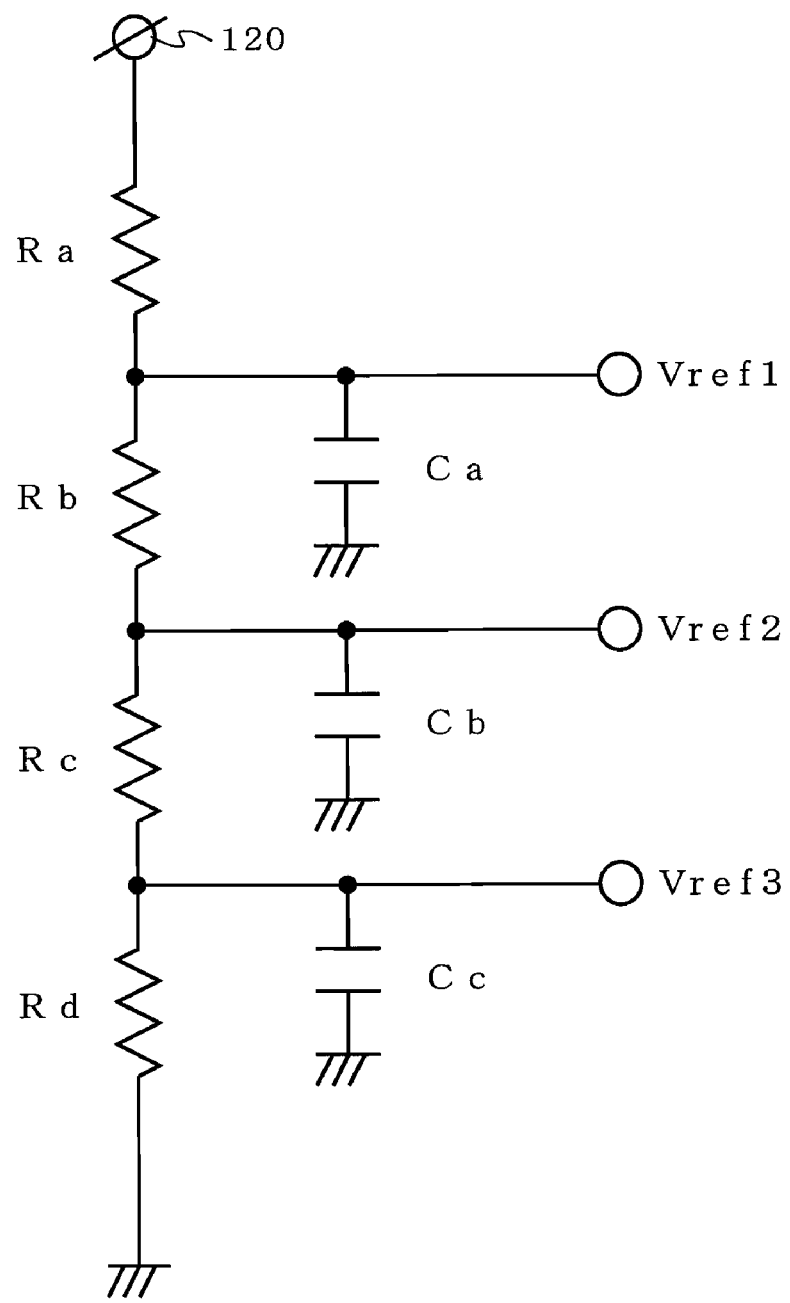
FIG. 4 is a diagram illustrating in detail an exemplary structure of a reference voltage generation section 114.

FIG. 4 is a diagram illustrating in detail an exemplary structure of the reference voltage generation section 114. The reference voltage generation section 114 shown in FIG. 4 includes: resistances Ra, Rb, Rc, and Rd which are connected in series with each other between a power supply terminal 120 and a predetermined voltage point (ground point in this example); and capacitive elements Ca, Cb, and Cc each grounding a connection point between the resistances Ra and Rb, a connection point between the resistances Rb and Rc, and a connection point between the resistances Rc and Rd. A voltage obtained at the connection point between the resistances Ra and Rb is outputted as the reference voltage Vref1, a voltage obtained at the connection point between the resistances Rb and Rc is outputted as the reference voltage Vref2, and a voltage obtained at the connection point between the resistances Rc and Rd is outputted as the reference voltage Vref3.

The capacitive elements Ca, Cb, and Cc are each a bypass capacitive element for suppressing a nose to be outputted from the reference voltage generation section 114, and even when the capacitive elements Ca, Cb, and Cc are connected to paths for supplying the reference voltages Vref1, Vref2, and Vref3, respectively, no influence is exerted on transient response and/or noise band characteristic of a PLL circuit. Therefore, the capacitive elements Ca, Cb, and Cc of sufficiently large sizes, each of which is necessary for suppressing a noise, can be provided in any manner. Even when the capacitive elements Ca, Cb, and Cc are not provided, the same effect can be achieved by the present invention.

When a voltage Vdd is applied to the power supply terminal 120 of the reference voltage generation section 114 shown in FIG. 4, the reference voltages Vref1, Vref2, and Vref3 are calculated by using equations [3] to [5], respectively, as follows.

$$Vref1 = Vdd \times (Rb+Rc+Rd)/(Ra+Rb+Rc+Rd) \quad [3]$$

$$Vref2 = Vdd \times (Rc+Rd)/(Ra+Rb+Rc+Rd) \quad [4]$$

$$Vref3 = Vdd \times Rd/(Ra+Rb+Rc+Rd) \quad [5]$$

When the voltage Vdd is a direct current (DC) voltage, each of the reference voltages Vref1, Vref2, and Vref3 is a direct current (DC) voltage. Further, values of the resistances Ra, Rb, Rc, and Rd are appropriately determined so as to allow the reference voltage generation section 114 to generate a reference signal of a desired voltage.

Referring to FIG. 1, an inductance of the inductors 104a and 104b is represented as L, a capacitance value of the variable capacitance elements 105a and 105b is represented as C1a, a capacitance value of the variable capacitance elements 106a and 106b is represented as C2a, a capacitance value of the variable capacitance elements 107a and 107b is represented as C3a, a capacitance value of the DC cut capacitive elements 108a and 108b is represented as C1b, a capacitance value of the DC cut capacitive elements 109a and 109b is represented as C2b, and a capacitance value of the DC cut capacitive elements 110a and 110b is represented as C3b. In this case, a resonant frequency fo of a parallel resonant circuit in which the inductor circuit and the variable capacitance circuits A, B, and C are connected in parallel with each other, is calculated in accordance with equation [6] as follows.

$$fo = 1/\left(2\pi \times \sqrt{2L \times C'/2}\right) = 1/\left(2\pi \times \sqrt{L \times C'}\right) \quad [6]$$

wherein $C' = C1a \times C1b/(C1a+C1b) +$ $C2a \times C2b/(C2a+C2b) + C3a \times C3b/(C3a+C3b)$ (1) Setting Example 1

Figure 5A:
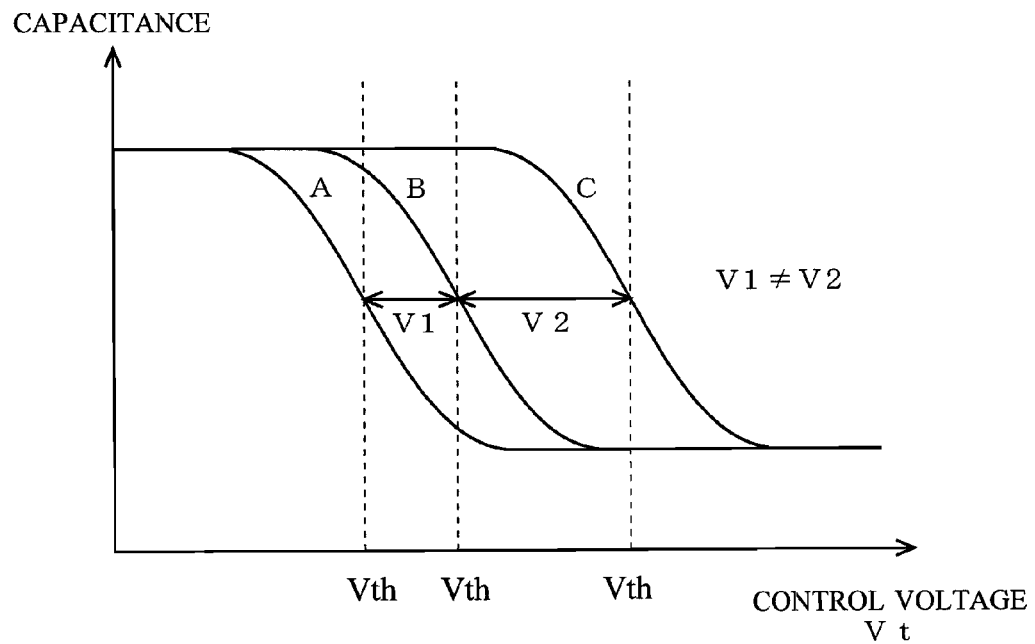
FIG. 5A is a diagram illustrating capacitance characteristic of the variable capacitance circuit of setting example 1 of the present invention.
Figure 5B:
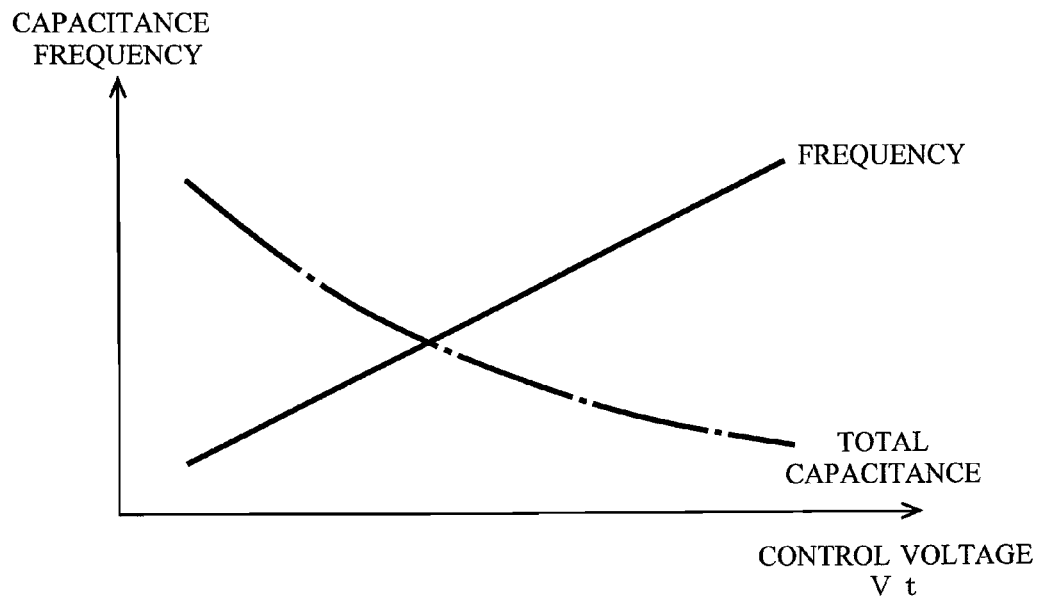
FIG. 5B is a diagram illustrating capacitance characteristic of the variable capacitance circuit and frequency characteristic of the voltage controlled oscillator of setting example 1 of the present invention.

A voltage difference between the reference voltage Vref1 and the reference voltage Vref2 is represented as V1, and a voltage difference between the reference voltage Vref2 and the reference voltage Vref3 is represented as V2. When V1≠V2, C1a=C2a=C3a, and C1b=C2b=C3b are satisfied, and a capacitance of each of the variable capacitance elements changes in the case of the control voltage Vt being in the neighborhood of Vth, the capacitance value of each of the variable capacitance circuits A, B, and C changes against the control voltage Vt as shown in FIG. 5A. When the voltage difference V1 is set so as to have a value different from the voltage difference V2 as shown in FIG. 5A, a total capacitance of the variable capacitance circuits A, B, and C is able to be proportional to $1/(fo^2)$ as indicated by the dashed-dotted line in FIG. 5B, thereby improving linear characteristic of a frequency.

Figure 6A:
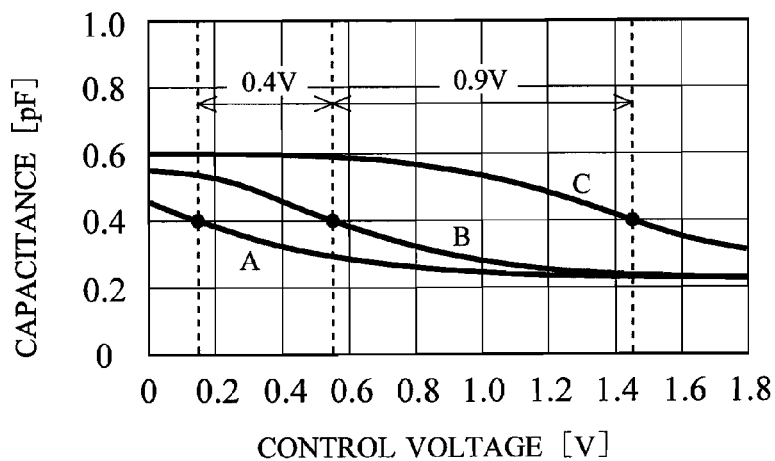
FIG. 6A and FIG. 6B are each a diagram illustrating capacitance characteristic of the variable capacitance circuit of setting example 1 of the present invention.
Figure 6B:
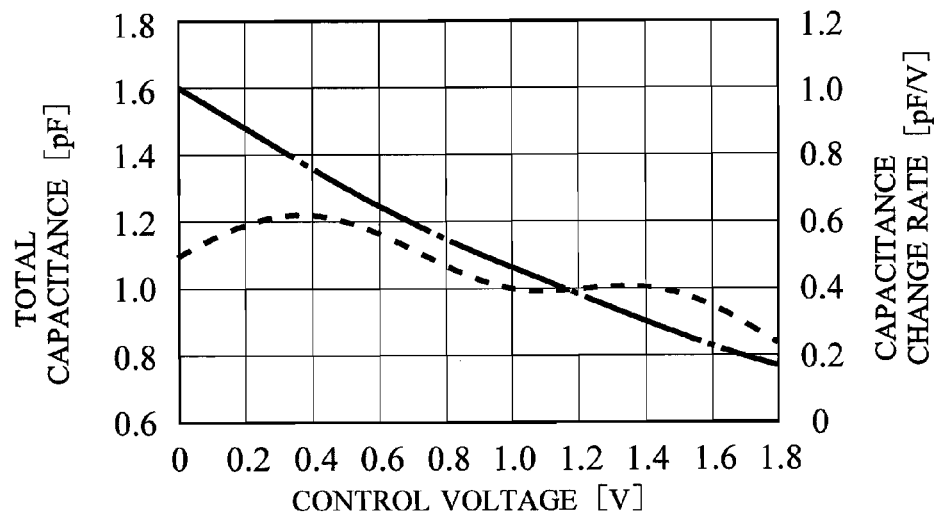
Figure 6C:
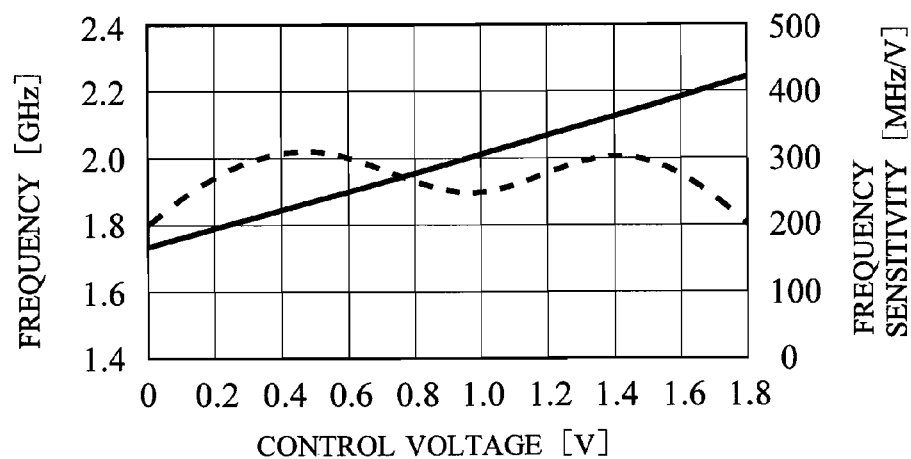
FIG. 6C is a diagram illustrating frequency characteristic of the voltage controlled oscillator of setting example 1 of the present invention.

For example, the reference voltages Vref1, Vref2, and Vref3 are set to 1.3V, 0.9V, and 0V, respectively, such that the voltage differences V1 and V2 are 0.4V and 0.9V, respectively. In this case, capacitance characteristics of the variable capacitance circuits A, B, and C are shown in FIG. 6A, a total capacitance and a capacitance change rate (a rate at which a capacitance changes against the control voltage Vt) are shown in FIG. 6B, and frequency characteristic and a frequency sensitivity (a rate at which a frequency changes against the control voltage Vt) are shown in FIG. 6C. When linear characteristic of a frequency is improved, a ratio between a maximum value and a minimum value of the frequency sensitivity (maximum value/minimum value) is reduced (although the ratio is greater than or equal to one). When a voltage Vdd applied to the power supply terminal 120 shown in FIG. 4 is 1.8V, and the resistances Ra, Rb, Rc, and Rd are set so as to have values of, for example, 5 kΩ, 4 kΩ, 9 kΩ, and 0 Ω, respectively, it is easy to set the reference voltages Vref1, Vref2, and Vref3 to 1.3V, 0.9V, and 0V, respectively.

Figure 7A:
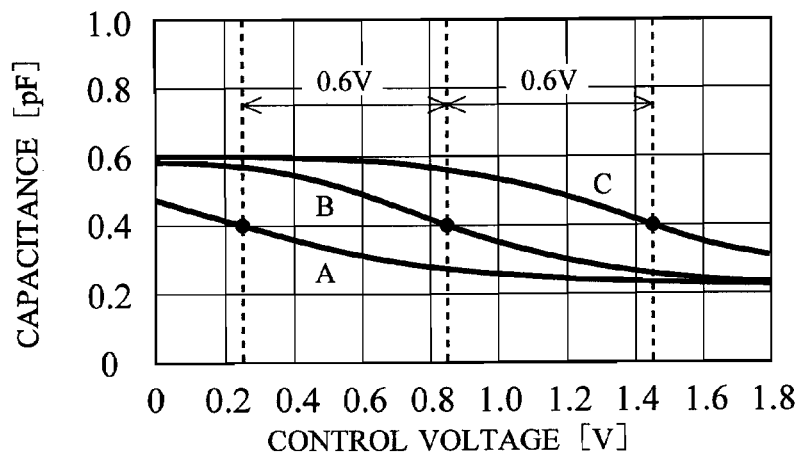
FIG. 7A and FIG. 7B are each a diagram illustrating capacitance characteristic of a variable capacitance circuit of setting example of a conventional art.
Figure 7B:
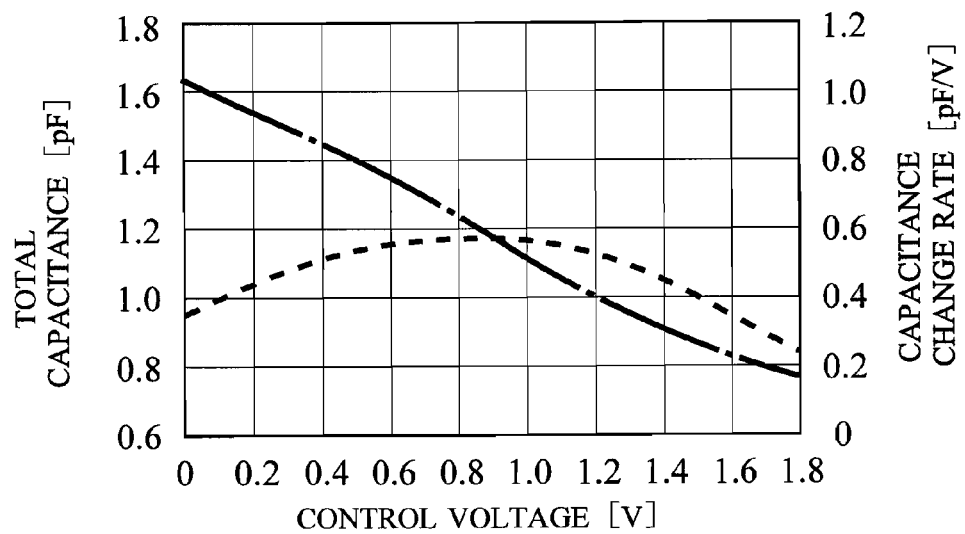
Figure 7C:
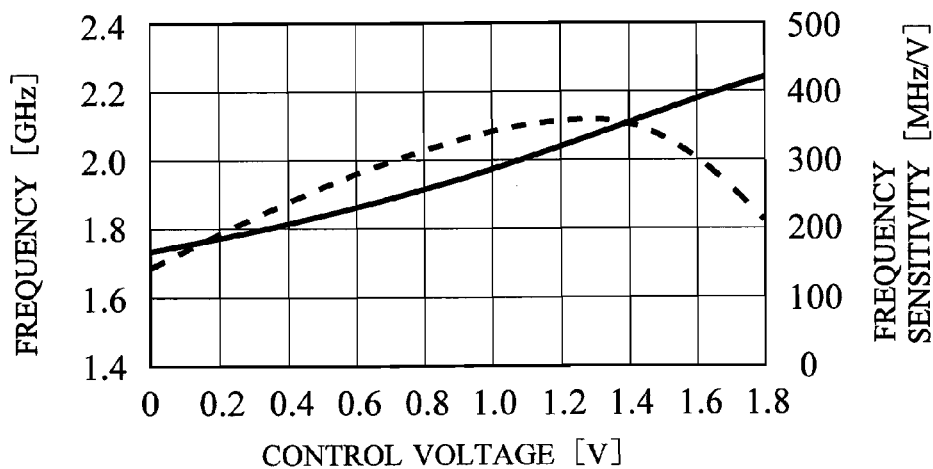
FIG. 7C is a diagram illustrating frequency characteristic of the voltage controlled oscillator of setting example of the conventional art.

For comparison, in a conventional art, the reference voltages Vref1, Vref2, and VrefB are set to 1.2V, 0.6V, and 0V, respectively, such that each of the voltage differences V1 and V2 is set to 0.6V. In this case, capacitance characteristics of the variable capacitance circuits A, B, and C are shown in FIG. 7A, and a total capacitance and a capacitance change rate are shown in FIG. 7B, and frequency characteristic and a frequency sensitivity are shown in FIG. 7C (in the case of the A-MOS transistor being used for each variable capacitance element). As shown in FIG. 8, the capacitance change rate is "2.75" in setting example 1 whereas the capacitance change rate is "2.33" in the conventional art, which indicates that the capacitance change rate represents the improved linear characteristic in the conventional art as compared to in setting example 1. However, the frequency sensitivity is "1.57" in setting example 1 whereas the frequency sensitivity is "2.53" in the conventional art, as shown in FIG. 8. That is, the linear characteristic of a frequency is improved in the present invention as compared to in the conventional art.

As described above, in setting example 1, the A-MOS transistor is used for each of the variable capacitance elements, and the voltage difference V1 between the reference voltages Vref1 and Vref2 applied to the variable capacitance circuits A and B, respectively, is set so as to be different from the voltage difference V2 between the reference voltages Vref2 and Vref3 applied to the variable capacitance circuits B and C, respectively, such that the total capacitance against the control voltage Vt is $1/(fo^2)$. Thus, the linear characteristic of the oscillation frequency can be improved.

(2) Setting Example 2

Figure 9A:
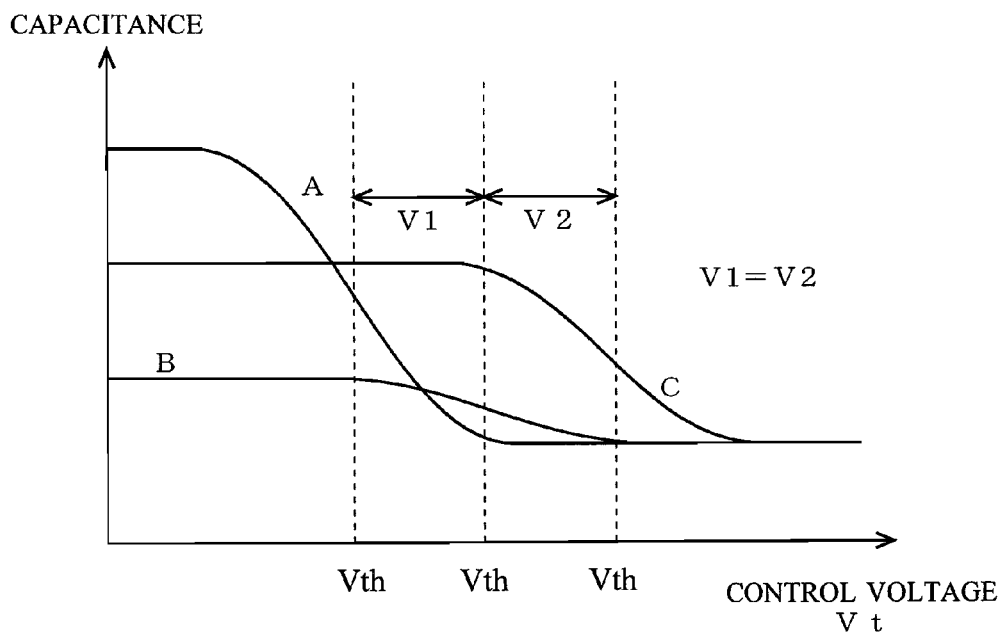
FIG. 9A is a diagram illustrating capacitance characteristic of the variable capacitance circuit of setting example 2 of the present invention.
Figure 9B:
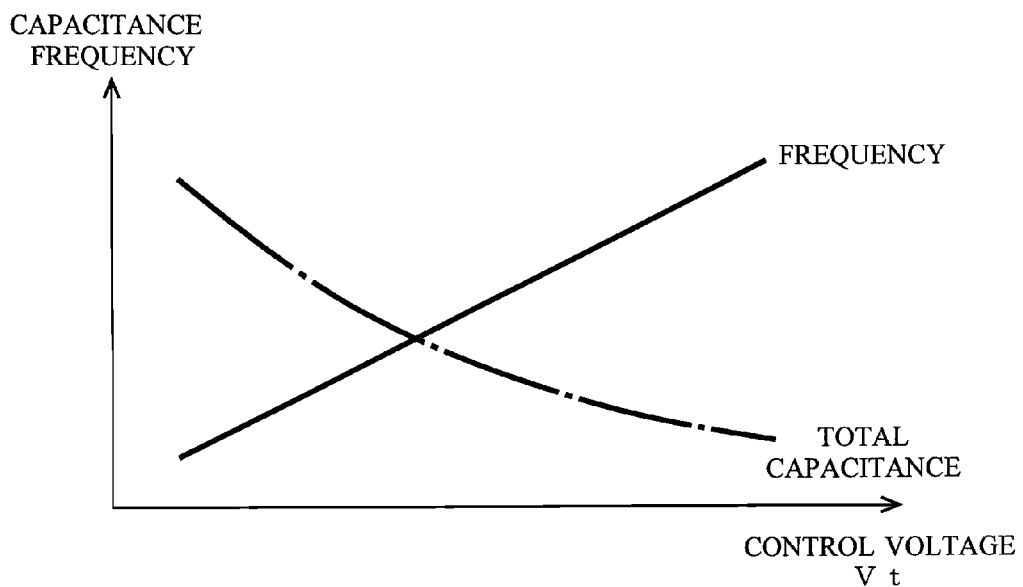
FIG. 9B is a diagram illustrating capacitance characteristic of the variable capacitance circuit and frequency characteristic of the voltage controlled oscillator of setting example 2 of the present invention.

The voltage difference between the reference voltage Vref1 and the reference voltage Vref2 is represented as V1, and the voltage difference between the reference voltage Vref2 and the reference voltage Vref3 is represented as V2. When V1=V2, C2a<C3a<C1a, and C2b<C3b<C1b are satisfied, and a capacitance of each of the variable capacitance elements changes in the case of the control voltage Vt being in the neighborhood of Vth, a capacitance value of each of the variable capacitance circuits A, B, and C changes against the control voltage Vt as shown in FIG. 9A. When the variable capacitance circuits have capacitance values different from each other, as shown in FIG. 9A, so as to satisfy a value for the variable capacitance circuit A> a value for the variable capacitance circuit C> a value for the variable capacitance circuit B, the total capacitance of the variable capacitance circuits A, B, and C is able to be proportional to $1/(fo^2)$ as indicated by the dashed-dotted line in FIG. 9B, thereby improving the linear characteristic of a frequency.

Figure 10A:
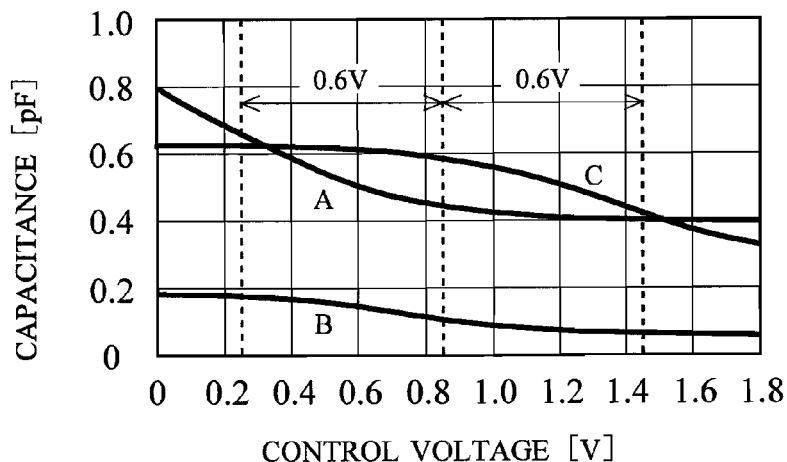
FIG. 10A and FIG. 10B are each a diagram illustrating capacitance characteristic of the variable capacitance circuit of setting example 2 of the present invention.
Figure 10B:
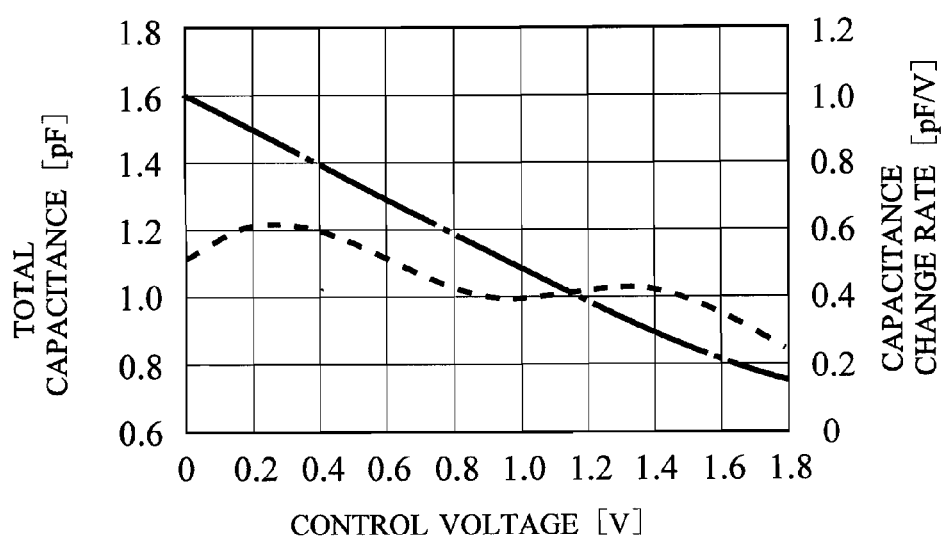
Figure 10C:
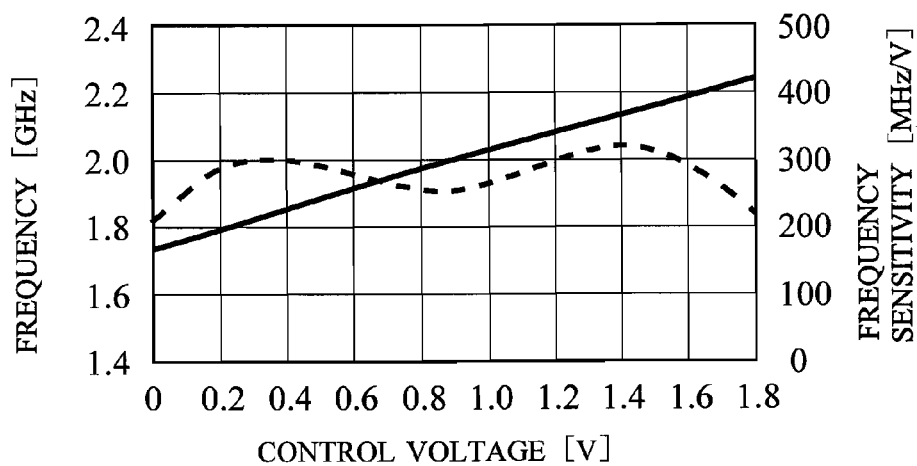
FIG. 10C is a diagram illustrating frequency characteristic of the voltage controlled oscillator of setting example 2 of the present invention.

For example, C1a:C2a:C3a=C1b:C2b:C3b=0.55:0.10:0.35 is satisfied, and the reference voltages Vref1, Vref2, and Vref3 are set to 1.2V, 0.6V, and 0V, respectively, such that each of the voltage differences V1 and V2 is 0.6V. In this case, capacitance characteristic of the variable capacitance circuits A, B, and C are shown in FIG. 10A, a total capacitance and a capacitance change rate are shown in FIG. 10B, and frequency characteristic and a frequency sensitivity are shown in FIG. 10C. In FIG. 1, the number of elements of each of the variable capacitance elements 105a and 105b is 11, the number of elements of each of the variable capacitance elements 106a and 106b is 2, and the number of elements of each of the variable capacitance elements 107a and 107b is 7, the capacitance value C1b of the DC cut capacitive elements 108a and 108b is set to 1.1 pF, the capacitance value C2b of the DC cut capacitive elements 109a and 109b is set to 0.2 pF, and the capacitance value C3b of the DC cut capacitive elements 110a and 110b is set to 0.7 pF. In this case, it is easy to set a ratio among the capacitance values of the variable capacitance circuits A, B, and C to 0.55:0.10:0.35. When the voltage Vdd applied to the power supply terminal 120 shown in FIG. 4 is 1.8V, and the resistances Ra, Rb, Rc, and Rd are set so as to have values of, for example, 6 kΩ, 6 kΩ, 6 kΩ, and 0Ω, respectively, it is easy to set the reference voltages Vref1, Vref2, and Vref3 to 1.2V, 0.6V, and 0V, respectively.

Comparing with the conventional art shown in FIGS. 7A, 7B, and 7C as described above, the capacitance change rate is "2.62" in setting example 2 whereas the capacitance change rate is "2.33" in the conventional art, as shown in FIG. 8, which indicates that the capacitance change rate represents improved linear characteristic in the conventional art as compared to in the present invention. However, the frequency sensitivity is "1.53" in setting example 2 whereas the frequency sensitivity is "2.53" in the conventional art, as shown in FIG. 8, which indicates that the linear characteristic of a frequency is improved in the present invention as compared to in the conventional art.

As described above, in setting example 2, the A-MOS transistor is used for each of the variable capacitance elements, and the ratio among the capacitance values of the variable capacitance circuits A, B, and C is set such that the total capacitance against the control voltage Vt is $1/(fo^2)$. Thus, the linear characteristic of the oscillation frequency can be improved.

(3) Setting Example 3

A voltage difference between the reference voltage Vref1 and the reference voltage Vref2 is represented as V1, and a voltage difference between the reference voltage Vref2 and the reference voltage Vref3 is represented as V2. In this case, when V1≠V2, C2a<C3a<C1a, and C2b<C3b<C1b are satisfied, and a capacitance of each of the variable capacitance elements changes in the case of the control voltage Vt being in the neighborhood of Vth, a capacitance value of each of the variable capacitance circuits A, B, and C changes against the control voltage Vt as shown in FIG. 9A as described for setting example 2. When the voltage difference V1 has a value different from the voltage difference V2, and the variable capacitance circuits have the capacitance values different from each other so as to satisfy a value for the variable capacitance circuit A> a value for the variable capacitance circuit C> a value for the variable capacitance circuit B, the total capacitance of the variable capacitance circuits A, B, and C is able to be proportional to $1/(fo^2)$ as indicated by the dashed-dotted line in FIG. 9B as described for setting example 2, thereby improving the linear characteristic of a frequency.

Figure 11A:
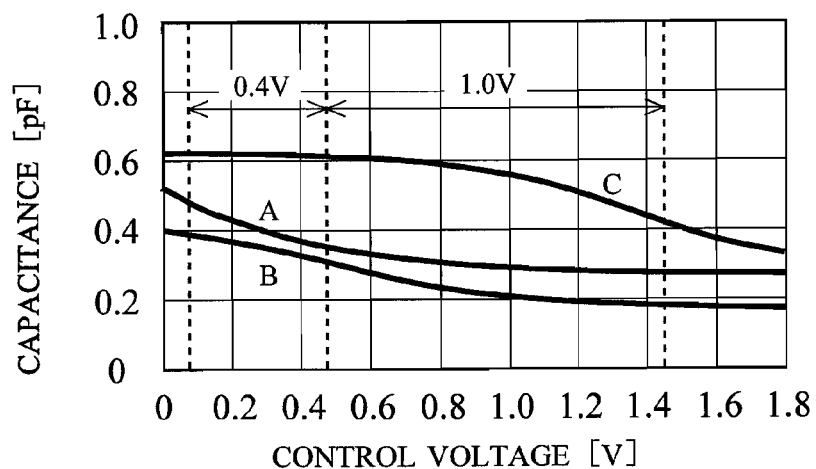
FIG. 11A and FIG. 11B are each a diagram illustrating capacitance characteristic of the variable capacitance circuit of setting example 3 of the present invention.
Figure 11B:
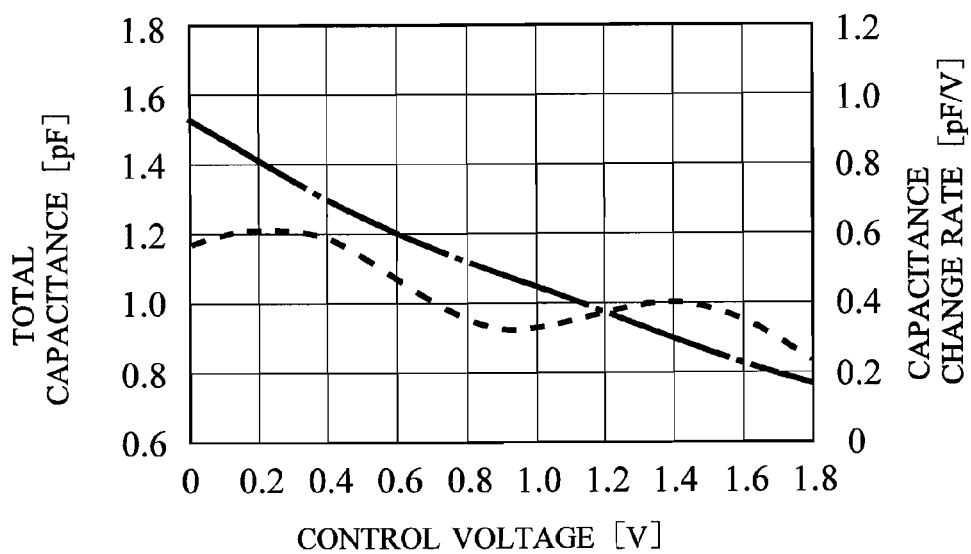
Figure 11C:
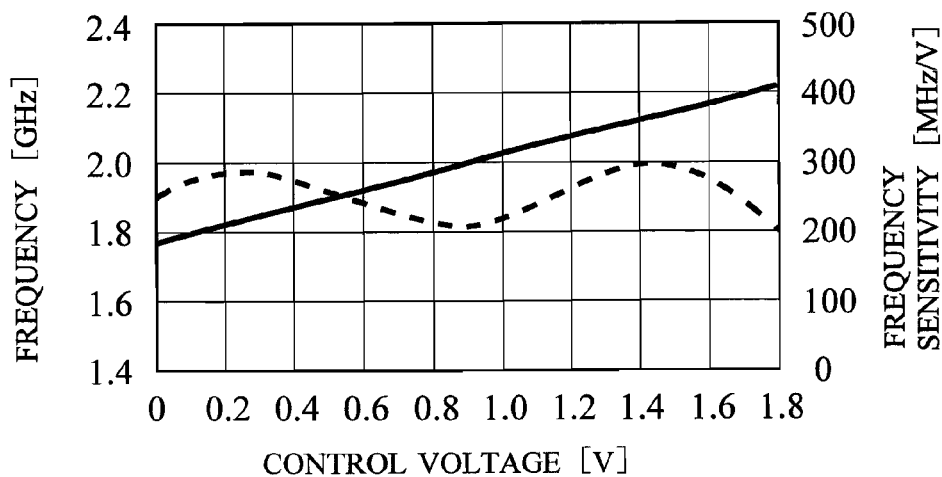
FIG. 11C is a diagram illustrating frequency characteristic of the voltage controlled oscillator of setting example 3 of the present invention.

For example, C1$a$:C2$a$:C3$a$=C1$b$:C2$b$:C3$b$=0.40:0.25: 0.35 is satisfied, the reference voltages Vref1, Vref2, and Vref3 are set to 1.4V, 1.0V, and 0V, respectively, such that the voltage differences V1 and V2 are 0.4V and 1.0V, respectively. In this case, capacitance characteristic of the variable capacitance circuits A, B, and C are as shown in FIG. 11A, a total capacitance and a capacitance change rate are as shown in FIG. 11B, and frequency characteristic and a frequency sensitivity are shown in FIG. 11C. In FIG. 1, the number of elements of each of the variable capacitance elements 105$a$ and 105$b$ is 8, the number of elements of each of the variable capacitance elements 106$a$ and 106$b$ is 5, the number of elements of each of the variable capacitance elements 107$a$ and 107$b$ is 7, the capacitance value C1$b$ of the DC cut capacitive elements 108$a$ and 108$b$ is 0.8 pF, the capacitance value C2$b$ of the DC cut capacitive elements 109$a$ and 109$b$ is 0.5 pF, and the capacitance value C3$b$ of the DC cut capacitive elements 110$a$ and 110$b$ is 0.7 pF. In this case, it is easy to set a ratio among the capacitance values of the variable capacitance circuits A, B, and C to 0.40:0.25:0.35. Further, when the voltage Vdd applied to the power supply terminal 120 shown in FIG. 4 is 1.8V, and the resistances Ra, Rb, Rc, and Rd are set so as to have values of, for example, 4 k Ω, 4 k Ω, 10 k Ω, and 0Ω, respectively, it is easy to set the reference voltages Vref1, Vref2, and Vref3 to 1.4V, 1.0V, and 0V, respectively.

Comparing with the conventional art shown in FIGS. 7A, 7B, and 7C as described above, as shown in FIG. 8, the capacitance change rate is "2.60" in setting example 3 whereas the capacitance change rate is "2.33" in the conventional art, which indicates that the capacitance change rate represents improved linear characteristic in the conventional art as compared to in the present invention. However, as shown in FIG. 8, the frequency sensitivity is "1.48" in setting example 3 whereas the frequency sensitivity is "2.53" in the conventional art, which indicates that the linear characteristic of a frequency is improved in the present invention as compared to in the conventional art.

As described above, in setting example 3, the A-MOS transistor is used for each of the variable capacitance elements. Further, the voltage difference V1 between the reference voltages Vref1 and Vref2 applied to the variable capacitance circuits A and B, respectively, is set so as to be different from the voltage difference V2 between the reference voltages Vref2 and Vref3 applied to the variable capacitance circuits B and C, respectively, and the voltage difference V1 is different from the voltage difference V2 and the ratio among the capacitance values of the variable capacitance circuits A, B, and C is set such that the total capacitance against the control voltage Vt is $1/(fo^2)$. Thus, the linear characteristic of the oscillation frequency can be improved.

According to the present embodiment, the number of the variable capacitance circuits connected in parallel with each other is three. However, the number of the variable capacitance circuits to be connected in parallel with each other may be four or more. In this case, the reference voltages representing values different from each other are outputted from the reference voltage generation section 114 so as to correspond to the four or more variable capacitance circuits, respectively, and applied to the gate terminals of the variable capacitance elements of the variable capacitance circuits, respectively. The reference voltages representing values different from each other so as to correspond to the four or more variable capacitance circuits may be set such that all the voltage differences each of which is obtained between two reference voltages having values which are immediately adjacent to each other in voltage level, do not represent the same value.

Further, although in the present embodiment the control voltage Vt is applied to the back gate terminal of the A-MOS transistor, the control voltage Vt may be applied to the gate terminal. Further, a bipolar transistor may be used for each of the oscillation transistors 103$a$ and 103$b$ instead of the MOS transistor. Also in this case, the same effect can be achieved. Further, the current source 101 may be connected between the power supply terminal 100 and the inductor circuit instead of to the negative resistance circuit. Also in this case, the same effect can be achieved.

(Example of Configuration in which the Voltage Controlled Oscillator is Used)

Figure 12:
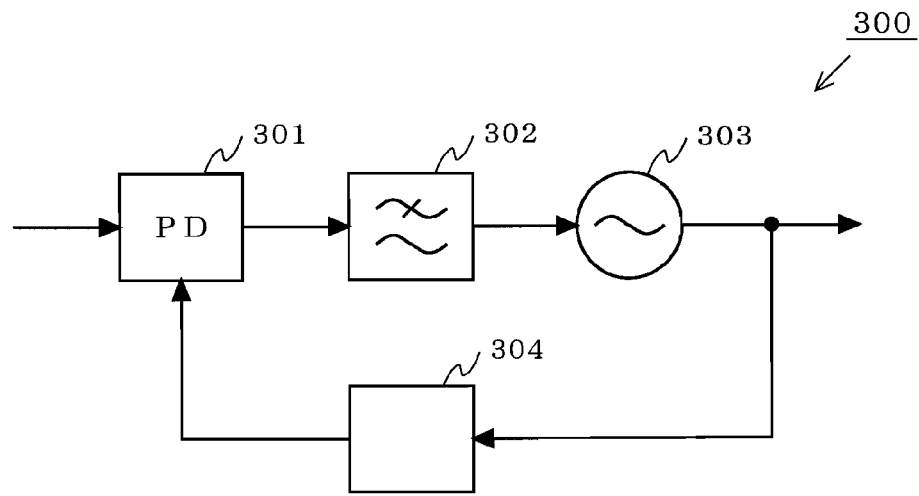
FIG. 12 is a diagram illustrating a configuration of a PLL circuit 300 using the voltage controlled oscillator of the present invention.

FIG. 12 is a diagram illustrating an exemplary configuration of a PLL circuit 300 using the voltage controlled oscillator according to the embodiment of the present invention. In FIG. 12, the PLL circuit 300 comprises: a phase comparator 301; a loop filter 302; the voltage controlled oscillator 303 according to the present invention; and a frequency divider 304.

The phase comparator 301 compares an inputted reference signal with a signal obtained by frequency-dividing an output signal of the voltage controlled oscillator 303 by using the frequency divider 304. A signal outputted by the phase comparator 301 is inputted as a control voltage Vt to the frequency control terminal 102 of the voltage controlled oscillator 303 through the loop filter 302. The voltage controlled oscillator 303 outputs a signal of a desired frequency based on the control voltage Vt. The PLL circuit 300 having such a configuration locks a desired frequency. The frequency divider 304 may be replaced with a mixer, or both the frequency divider 304 and a mixer may be used.

Figure 13:
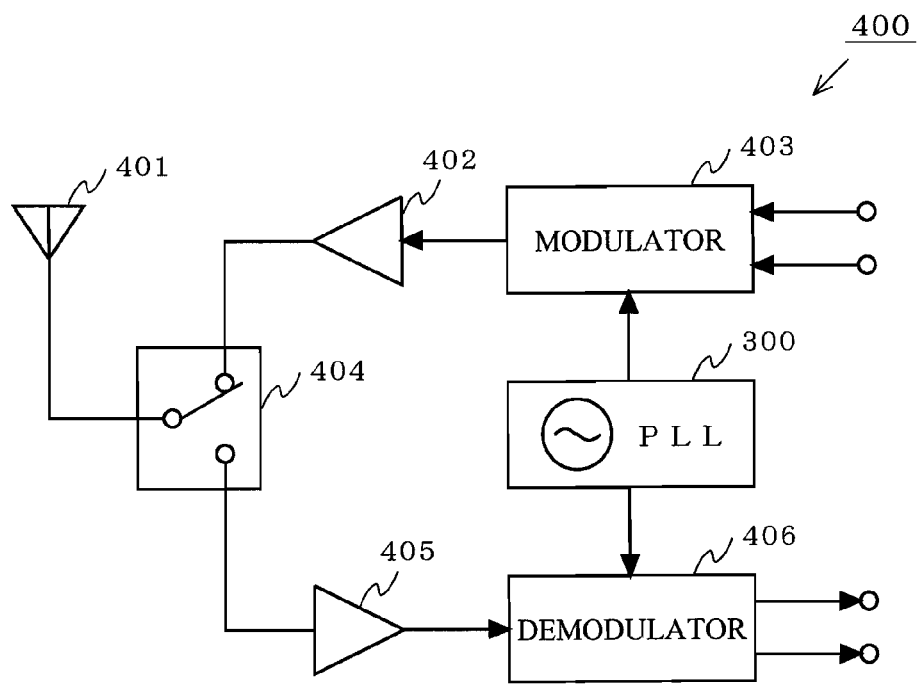
FIG. 13 is a diagram illustrating a configuration of a radio communication apparatus using the PLL circuit shown in FIG. 12.
Figure 15A:
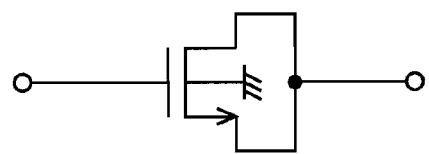
FIG. 15A shows an element used for a variable capacitance element of a conventional voltage controlled oscillator.
Figure 15B:
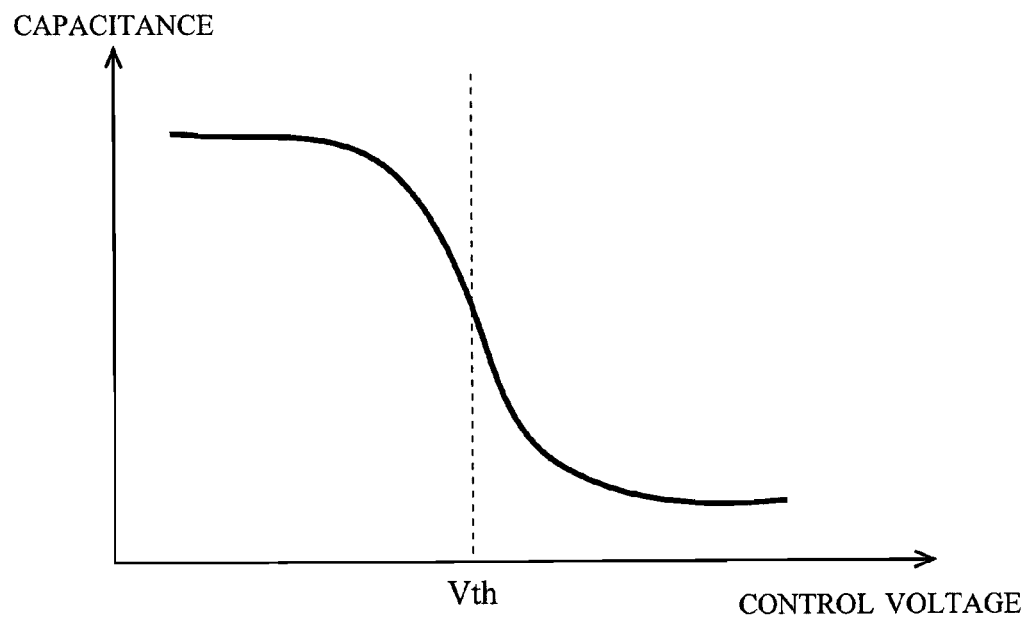
FIG. 15B is a diagram illustrating capacitance characteristic of the variable capacitance element of the conventional voltage controlled oscillator.
Figure 17A:
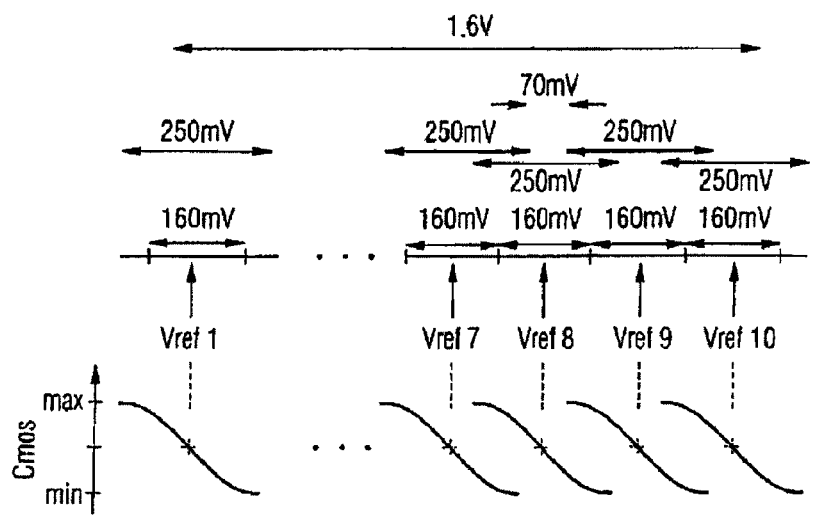
FIG. 17A and FIG. 17B are each a diagram illustrating capacitance characteristic of variable capacitance elements of the another conventional voltage controlled oscillator.
Figure 17B:
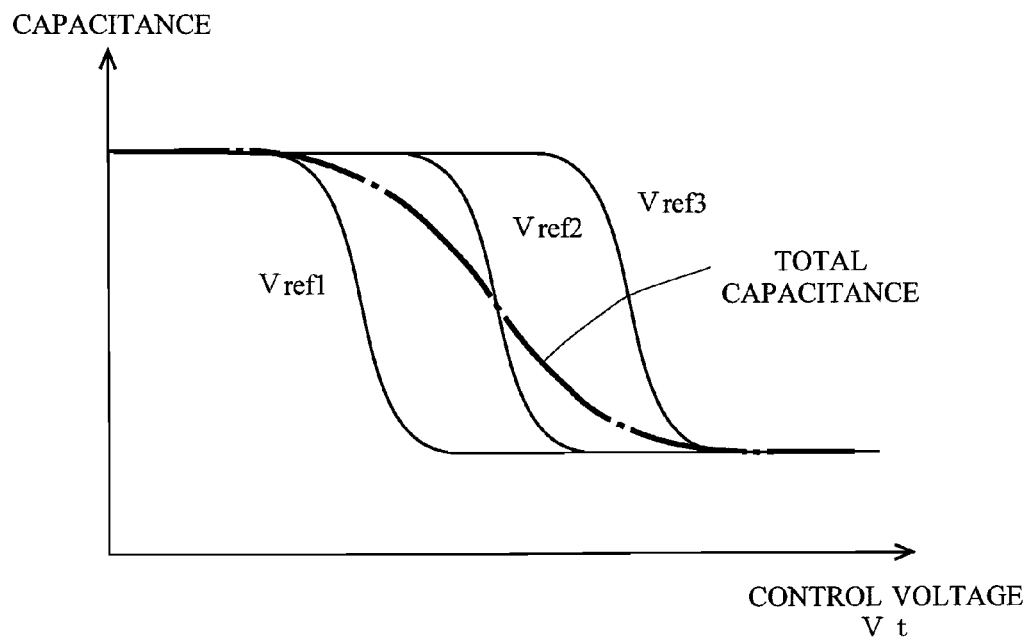

FIG. 13 is a diagram illustrating an exemplary configuration of a radio communication apparatus 400 using the PLL circuit 300 as described above. As shown in FIG. 13, the radio communication apparatus 400 comprises: an antenna 401; a power amplifier 402; a modulator 403; a switch 404; a low noise amplifier 405; a demodulator 406; and the PLL circuit 300.

When a radio signal is transmitted, the modulator 403 modulates a desired radio frequency signal outputted by the PLL circuit 300 by using a baseband modulation signal, so as to output a modulated signal. A radio frequency modulated signal outputted by the modulator 403 is amplified by the power amplifier 402, and transmitted from the antenna 401 through the switch 404. When a radio signal is received, a radio frequency modulated signal received by the antenna 401 is inputted to the low noise amplifier 405 through the switch 404, and amplified by the low noise amplifier 405, so as to be inputted to the demodulator 406. The demodulator 406 demodulates the inputted radio frequency modulated signal to a baseband modulation signal by using a radio frequency signal outputted by the PLL circuit 300. The PLL circuit 300 may be individually provided on each of the transmission side and the reception side. Furthermore, the PLL circuit 300 may double as a modulator.

As described above, it is possible to realize the PLL circuit and the radio communication apparatus enabling improvement of the linear characteristic represented by the frequency sensitivity changing in a wide range of control voltage.

As described above, the voltage controlled oscillator according to the present invention is capable of improving the linear characteristic of the oscillation frequency changing in a wide range of control voltage, and therefore transient response and/or noise band characteristic of the PLL circuit are allowed to be constant in a wide band, and an oscillator improving phase noise characteristic can be realized.

While the invention has been described in detail, the foregoing description is in all aspects illustrative and not restrictive. It is understood that numerous other modifications and variations can be devised without departing from the scope of the invention.

What is claimed is:

1. A voltage controlled oscillator comprising:
   an inductor circuit having an inductor;
   n variable capacitance circuits each having a variable capacitance element and having blocking capacitors for interrupting a direct current at both ends thereof, said n variable capacitance circuits including first, second and third variable capacitance circuits, wherein n is an integer greater than or equal to three;
   a negative resistance circuit; and
   a reference voltage generation section having m resistances connected in series between a power supply voltage and a grounding potential, wherein
   m is an integer greater than or equal to two,
   said inductor circuit, said n variable capacitance circuits, and said negative resistance circuit are connected in parallel,
   said reference voltage generation section divides the power supply voltage with said m resistances to supply m reference voltages to a first terminal of said variable capacitance elements of said n variable capacitance circuits from m connecting points between adjacent resistances of said m resistances,
   second terminals of said variable capacitance elements of said n variable capacitance circuits are configured to receive a control voltage for feedback controlling an oscillation frequency,
   said n variable capacitance circuits are connected in parallel with each other such that capacitance values of each variable capacitance circuit, against such control voltage inputted to each variable capacitance circuit, are changed so as to all increase or all decrease,
   the control voltage inputted to the second terminals of said variable capacitance elements of said n variable capacitance circuits is the same voltage,
   said reference voltage generation section has a first resistance and a second resistance connected successively and is configured such that a first reference voltage is supplied from a connection point positioned between said first resistance and the power supply voltage, a second reference voltage is supplied from a connection point between said first resistance and said second resistance, a third reference voltage is supplied from a connection point positioned between said second resistance and the grounding potential, and the resistance values of said first resistance and said second resistance are different than each other,
   of said n variable capacitance circuits, the first reference voltage is inputted to the first terminal of said first variable capacitance circuit, the second reference voltage is inputted to the first terminal of said second variable capacitance circuit, and the third reference voltage is inputted to the first terminal of said third variable capacitance circuit,
   the first reference voltage, the second reference voltage, and the third reference voltage are fixed respectively,
   a k-th variable capacitance circuit has a capacitance value different from a (k−1)th variable capacitance circuit, wherein k is an integer ranging from 2 to n, inclusive, and
   a ratio among maximum capacitance values of said variable capacitance element of said first variable capacitance circuit, said variable capacitance element of said second variable capacitance circuit, and said variable capacitance element of said third variable capacitance circuit is not an equal ratio.

2. A voltage controlled oscillator comprising:
   an inductor circuit having an inductor;
   n variable capacitance circuits each having a variable capacitance element and having blocking capacitors for interrupting a direct current at both ends thereof, said n variable capacitance circuits including first, second and third variable capacitance circuits, wherein n is an integer greater than or equal to three;
   a negative resistance circuit; and
   a reference voltage generation section having m resistances connected in series between a power supply voltage and a grounding potential, wherein
   m is an integer greater than or equal to two,
   said inductor circuit, said n variable capacitance circuits, and said negative resistance circuit are connected in parallel,
   said reference voltage generation section divides the power supply voltage with said m resistances to supply m reference voltages to a first terminal of said variable capacitance elements of said n variable capacitance circuits from m connecting points between adjacent resistances of said m resistances,
   second terminals of said variable capacitance elements of said n variable capacitance circuits are configured to receive a control voltage for feedback controlling an oscillation frequency,
   said n variable capacitance circuits are connected in parallel with each other such that capacitance values of each variable capacitance circuit, against such control voltage inputted to each variable capacitance circuit, are changed so as to all increase or decrease,
   the control voltage inputted to the second terminals of said variable capacitance elements of said n variable capacitance circuits is the same voltage,
   said reference voltage generation section has a first resistance and a second resistance connected successively and is configured such that a first reference voltage is supplied from a connection point positioned between said first resistance and the power supply voltage, a second reference voltage is supplied from a connection point between said first resistance and said second resistance, a third reference voltage is supplied from a connection point positioned between said second resistance and the grounding potential, and the resistance values of said first resistance and said second resistance are different than each other,
   of said n variable capacitance circuits, the first reference voltage is inputted to the first terminal of said first variable capacitance circuit, the second reference voltage is inputted to the second terminal of said second variable capacitance circuit, and the third reference voltage is inputted to the third terminal of said third variable capacitance circuit, the first reference voltage, the second reference voltage, and the third reference voltage are fixed respectively, a k-th variable capacitance circuit has a capacitance value different from a (k−1)th variable capacitance circuit, wherein k is an integer ranging from 2 to n, inclusive, a first difference between the first reference voltage and the second reference voltage and a second difference between the second reference voltage and the third reference voltage are different than each other, and a ratio among maximum capacitance values of said variable capacitance element of said first variable capacitance circuit, said variable capacitance element of said second variable capacitance circuit, and said variable capacitance element of said third variable capacitance circuit is not an equal ratio.

3. The voltage controlled oscillator according to claim 1, wherein said variable capacitance element of at least one of said first variable capacitance circuit, said second variable capacitance circuit, and said third variable capacitance circuit is an accumulation MOS.

4. The voltage controlled oscillator according to claim 2, wherein said variable capacitance element of at least one of said first variable capacitance circuit, said second variable capacitance circuit, and said third variable capacitance circuit is an accumulation MOS.

5. A radio communication apparatus having a PLL circuit outputting a signal of a target frequency, said PLL circuit having the voltage controlled oscillator according to claim 1.

6. A radio communication apparatus having a PLL circuit outputting a signal of a target frequency, said PLL circuit having the voltage controlled oscillator according to claim 2.

* * * * *